United States Patent [19]
Tanaka et al.

[11] Patent Number: 5,675,278
[45] Date of Patent: Oct. 7, 1997

[54] LEVEL SHIFTING CIRCUIT

[75] Inventors: Shinichi Tanaka; Takehiro Takayanagi, both of Ibaraki-ken; Yasuhisa Uchida, Ohita-ken, all of Japan

[73] Assignee: Texas Instruments Incorporated/Hiji High-Tech Co., Ltd., Dallas, Tex.

[21] Appl. No.: 654,816

[22] Filed: May 29, 1996

Related U.S. Application Data

[63] Continuation of Ser. No. 390,174, Feb. 17, 1995, abandoned.

[30] Foreign Application Priority Data

Feb. 9, 1994 [JP] Japan ................................ 6-015337

[51] Int. Cl.$^6$ ........................... H03L 5/00; H03K 19/0175
[52] U.S. Cl. ........................ 327/333; 323/315; 326/83
[58] Field of Search ................................ 327/108, 112, 327/437, 436, 391, 309, 541, 333, 318, 319, 321; 326/63, 68, 83, 121; 323/315, 316

[56] References Cited

U.S. PATENT DOCUMENTS

| | | | |
|---|---|---|---|
| 4,558,242 | 12/1985 | Tuthill et al. | 327/437 |
| 4,622,480 | 11/1986 | Uchimura et al. | 327/337 |
| 4,703,199 | 10/1987 | Ely | 326/63 |
| 4,712,021 | 12/1987 | Gollinger | 326/121 |
| 4,868,415 | 9/1989 | Dunn | 327/122 |
| 4,887,048 | 12/1989 | Krenik et al. | 330/258 |
| 4,937,480 | 6/1990 | Higuchi et al. | 327/437 |
| 5,091,701 | 2/1992 | Butler | 330/252 |
| 5,237,212 | 8/1993 | Maekawa | 326/63 |
| 5,317,214 | 5/1994 | Lewis | 326/63 |
| 5,327,099 | 7/1994 | Fergus | 330/254 |
| 5,341,047 | 8/1994 | Rosenthal | 326/68 |
| 5,376,839 | 12/1994 | Horiguchi et al. | 327/541 |
| 5,451,859 | 9/1995 | Ryat | 323/312 |
| 5,465,069 | 11/1995 | Boiron et al. | 327/333 |

FOREIGN PATENT DOCUMENTS 403062720  7/1989  Japan ................................ 327/333

*Primary Examiner*—Timothy P. Callahan
*Assistant Examiner*—My-Trang Nu Ton
*Attorney, Agent, or Firm*—Richard L. Donaldson; William B. Kempler

[57] ABSTRACT

An output circuit of a level shifter or an operational amplifier which converts input signal voltages to different voltage levels. A pMOS transistor $PT_2$ and nMOS transistor $NT_2$ connected in series between the power source and ground constitute the output node $ND_{12}$. A Wilson mirror is made of pMOS transistors $PT_3$–$PT_6$. An nMOS transistor $NT_3$ induces a current flow in the current mirror, and an nMOS transistor $NT_1$ connected between the current output node $ND_1$ of the current mirror and ground. The gate of pMOS transistor $PT_2$ is connected to the current output node $ND_1$, and the gates of nMOS transistor $NT_1$ and nMOS transistors $NT_2$ and $NT_3$ are connected to the input line of signals IN and XIN, which are 180° out of phases.

2 Claims, 8 Drawing Sheets

|  | BUFFER AMP 1CH (μA) | CHIP TOTAL (mA) |
|---|---|---|
| PRODUCT OF PRESENT INVENTION | 24.12 | 4.78 |
| CONVENTIONAL PRODUCT | 102.0 | 19.6 |

5,675,278

LEVEL SHIFTING CIRCUIT

This application is a continuation of application Ser. No. 08/390,174, filed Feb. 17, 1995, now abandoned.

BACKGROUND OF THE INVENTION

1. Field of the Invention

Our invention pertains to an output circuit of a level shifter or an operational amplifier which converts input signal voltages to different voltage levels.

2. Description of Prior Art

FIG. 12 is a circuit diagram illustrating an example of the construction of a level shifter as a conventional output circuit.

In FIG. 12, $PT_1$ and $PT_2$ indicate p-channel MOS (pMOS) transistors, $NT_1$ and $NT_2$ indicate n-channel MOS (nMOS) transistors, and IN and XIN indicate complementary level input signals, respectively.

The sources of pMOS transistors $PT_1$ and $PT_2$ are connected to the high-voltage supply line $V_{EE}$ (e.g., 15 V), and the sources of nMOS transistors $NT_1$ and $NT_2$ are connected to ground.

The drains of pMOS transistor $PT_1$ and nMOS transistor $NT_1$ are connected to each other, the node $ND_1$ is constructed at the midpoint of the connection, and this node $ND_1$ is connected to the gate of pMOS transistor $PT_2$.

The drains of pMOS transistor $PT_2$ and nMOS transistor $NT_2$ are connected to each other, the node $ND_2$ is constructed at the midpoint of the connection, and this node $ND_2$ is connected to the output terminal $T_{OUT}$ and the gate of pMOS transistor $PT_1$.

The gate of nMOS transistor $NT_1$ is connected to the input terminal $T_{IN}$ of signal IN, and the gate of nMOS transistor $NT_2$ is connected to the input terminal $T_{XIN}$ of signal XIN.

In such a construction, for instance, the signal which has been switched from the ground level 0 V to the power source voltage $V_{DD}$ level, for example, 5 V, is supplied to the gate of nMOS transistor $NT_1$, the signal XIN which has a level complementary to that of signal IN, is switched from 5 V to 0 V and is supplied to the gate of nMOS transistor $NT_2$. Consequently, the nMOS transistor $NT_1$ will be in the on state, and the nMOS transistor $NT_2$ will be in the off state.

Because the nMOS transistor $NT_1$ is in the on state, the node $ND_1$ is pulled to the ground level, and the gate potential of pMOS transistor $PT_2$ is lowered along with this phenomenon, the pMOS transistor $PT_2$ will be in the on state. Consequently, the node $ND_2$ will be pulled up to the high voltage $V_{EE}$.

That is, the input voltage of 5 V is converted to high voltage $V_{EE}$ of 15 V, and output as OUT.

Also, the high voltage $V_{EE}$ level of the output side node $ND_2$ is supplied to the gate of pMOS transistor $PT_1$. In this manner, the pMOS transistor $PT_1$ will be maintained securely in the off state, and the supply of high voltage $V_{EE}$ to the input side node $ND_1$ is cut off. Consequently, the lowering of the potential of node $ND_1$ is accelerated, and the output OUT is maintained constant at the high voltage $V_{EE}$ level.

At this point, the input signal level is switched, the signal IN is supplied to the gate of nMOS transistor $NT_1$ at 0 V, and signal XIN, which has a level complementary to that of signal IN, is supplied to the gate of nMOS transistor $NT_2$ at 5 V. The nMOS transistor $NT_1$ is then switched from the on state to the off state, and the nMOS transistor $NT_2$ is switched from the off state to the on state.

Accompanying the fact that the nMOS transistor $NT_2$ is in the on state, the output side node $ND_2$ is pulled to the ground level. Consequently, the input voltage of 0 V is output as OUT at 0 V.

Accompanying the fact that the output side node $ND_2$ is pulled to the ground level, the gate potential of pMOS transistor $PT_1$ is lowered, and the pMOS transistor $PT_1$ will be in the on state. Consequently, the node $ND_1$ is pulled up to high voltage $V_{EE}$.

The high voltage $V_{EE}$ level of input side node $ND_1$ is supplied to the gate of pMOS transistor $PT_2$. In this manner, the pMOS transistor $PT_2$ is kept in the off state, and the supply of high voltage $V_{EE}$ to the output side node $ND_2$ is cut off. Consequently, the lowering of the potential of node $ND_2$ is accelerated, and the output OUT is kept at the ground level.

Also, the source drive IC of TFT (thin film transistor) type liquid crystal device samples and holds the analog input, buffers the voltage buffered with the operational amplifier, which is voltage-follower-connected, and drives the source of the TFT-type liquid crystal device.

The operational amplifier used here must be able to drive capacitances of several hundred picofarads, which the liquid crystal panel has at high speeds, and the circuit scale must be small because of multiple channels that accompany the large liquid crystal panels. In actuality, at least one operational amplifier is used for each channel.

FIG. 13 is a circuit diagram illustrating an example of the construction of a CMOS operational amplifier as a conventional output circuit.

In FIG. 13, $PT_{11}$–$PT_{16}$ indicate pMOS transistors, $NT_{11}$–$NT_{13}$ indicate nMOS transistors, and $I_{11}$ and $I_{12}$ indicate current sources, respectively.

The sources of pMOS transistors $PT_{11}$ and $PT_{12}$ are connected to each other, the source of pMOS transistors $PT_{13}$–$PT_{16}$ is connected to the supply line of power source voltage $V_{DD}$, and the source of nMOS transistors $NT_{11}$–$NT_{13}$ is connected to ground.

The drains of pMOS transistor $PT_{11}$ and nMOS transistor $NT_{11}$ are connected to each other to constitute node $ND_{11}$. Also, the drains of pMOS transistor $PT_{12}$ and nMOS transistor $NT_{12}$ are connected to each other, the gates of nMOS transistors $NT_{11}$ and $NT_{12}$ are connected to each other, and the midpoint of the connection of these gates is connected to the drain of nMOS transistor $NT_{12}$ to constitute the first stage of the differential amplifier.

Node $ND_{11}$, which is the output of this differential amplifier, is connected to the gate of nMOS transistor $NT_{13}$.

The drains of pMOS transistor $PT_{16}$ and nMOS transistor $NT_{13}$ are connected to each other to constitute the output amplification stage. The output side node $ND_{12}$ is comprised by the midpoint of the connection of these drains. This node $ND_{12}$ is connected to the output terminal $T_{OUT}$.

The gates of pMOS transistors $PT_{13}$ and $PT_{14}$ are connected, and the midpoint of the connection of these gates is connected to both the drain of pMOS transistor $PT_{13}$ and the current source $I_{11}$ to constitute the current mirror. The drain of pMOS transistor $PT_{14}$ is connected to the midpoint of the connection of the sources of pMOS transistors $PT_{11}$ and $PT_{12}$, which constitute the differential amplifier. In this manner, a constant current is supplied from the current mirror to the differential amplifier.

In the same manner, the gates of pMOS transistors $PT_{15}$ and $PT_{16}$ are connected to each other, and the midpoint of the connection of these gates is connected to both the drain of pMOS transistor $PT_{15}$ and the current source $I_{12}$ to constitute the current mirror. With this current mirror, a constant current is supplied to the output amplification stage.

The gate of pMOS transistor $PT_{11}$ of first stage differential amplifier is connected to the input terminal $T_{IN}$ of signal IN, and the gate of pMOS transistor $PT_{12}$ is connected to the output side node $ND_{12}$.

The first stage differential amplifier is an amplifier with a gain of "1" since the noninverting input is comprised by the gate of pMOS transistor $PT_{11}$, inverting input is comprised by the gate of pMOS transistor $PT_{12}$ and is connected to the output.

Between the gate and the drain of nMOS transistor $NT_{13}$ in the output stage, the phase complementary capacitor $C_{11}$ is connected.

The CMOS operational amplifier in FIG. 13 outputs the OUT, which has a voltage identical to the input applied voltage IN. Since the output stage is driving at a constant current, this operational amplifier carries out A-class operations.

PROBLEMS TO BE SOLVED BY THE INVENTION

However, there was a problem in the aforementioned conventional level shifter in which characteristics, such as switching speed, current consumption, etc., depend significantly on the load capacitance attached to the output.

That is, for instance, a gate, etc., with a large capacitance is connected to the output terminal $T_{OUT}$, during the aforementioned operation where the input signal IN is switched from 0 V to 5 V, and the signal XIN is switched from 5 V to 0 V, the raising of the potential of output OUT to the load capacitance by charging is delayed, and the switching of pMOS transistor $PT_1$ from the on state to the off state will be delayed. This delay in the state shift will delay the lowering of the potential of input side node $ND_1$, and also delays the raising of the OUT potential that accompanies the switching of pMOS transistor $PT_2$ from the off state to the on state.

The cause of this phenomenon is that the output is fed back to the pMOS transistor $PT_1$. Since the gate of pMOS transistor $PT_1$ is connected to the output side node $ND_2$, the delay of the output is also fed back to the pMOS transistor $PT_1$, and consequently, the operation of the entire circuit is delayed.

Consequently, the time that both pMOS and nMOS transistors $PT_2$ and $NT_2$, which are connected in series, are maintained in the on state will increase, the through current will flow and the current consumption will increase.

As the liquid crystal panel becomes larger and higher resolution is obtained, operational amplifiers with higher speeds are needed. While the CMOS operational amplifier of FIG. 13 can discharge a load capacitance at a high speed, the speed of charging is determined by the constant current of the current mirror, which is composed of pMOS transistors $PT_{15}$ and $PT_{16}$. Thus, the constant current must be increased to realize high speeds.

Since this current maintains a constant flow even after the state in which the output voltage is equal to the input voltage is reached by charging the load, the current consumption will be large.

To solve this problem, a circuit wherein the amplifier for charging and the amplifier for discharging are connected in parallel, as illustrated in FIG. 14, is proposed.

However, in such a circuit, switches $SW_{11A}$, $SW_{12A}$, $SW_{11B}$, and $SW_{12B}$ for switching between the amplifier for charging $AMP_A$ and the amplifier for discharging $AMP_B$ will be needed. Also, two amplifiers are needed for each channel. Thus, the circuit has the problem in which it invites large sizes.

The present invention is made taking said situation into consideration. The purpose is to offer an output circuit in which the operational speed can be increased, the through current can be reduced, low power consumption can be expected, and the size will not be large.

MEANS TO SOLVE THE PROBLEMS

To realize the aforementioned purpose, the first output circuit of the present invention has a current source, which is connected to the first power source potential and has the first and second current supply terminals, a first transistor, which makes the path between the first current supply terminal the second power source potential conductive in accordance with the input signal, a second transistor, which makes the path between the second current supply terminal and the second power source potential conductive in accordance with the input signal, a third transistor, which makes the path between the output terminal and the second power source potential conductive in accordance with the input signal, and a fourth transistor, which makes the path between the aforementioned output terminal and the first power source potential conductive in accordance with the potential of the second current supply terminal, and the first and third transistors and the second and fourth transistors respectively operate in an in-phase manner, and the first and second transistors and the third and fourth transistors respectively operate in a complementary manner.

The second output circuit of the present invention has a first current source, which supplies the first and second current, which are in a proportional relationship, a second current source, which supplies the third current, a constant current means, which makes the total of the second and third current constant, a first transistor, which either charges or discharges the output terminal with the current that is proportional to the third current, a second transistor, which discharges or charges the aforementioned output terminal in accordance with the input signal, and a third transistor, which controls the current of the first current in a proportional relationship with the current that flows in the second transistor in accordance with the aforementioned input signal.

FUNCTION

In the first output circuit of the present invention, for instance, when the second transistor is controlled to be in the on (conductive) state by the input signal and the first and third transistors are controlled to be in the off (nonconductive) state, the potential of the second current supply terminal of the current source will be approximately equal to the second power source potential; thus, the fourth transistor will be in the on state. Since the third transistor is in the off state and the fourth transistor is in the on state, the first power source potential signal level is output from the output terminal.

On the other hand, when the second transistor is controlled to be in the off state by the input signal and the first and third transistors are controlled to be in the on state, the potential of the second current supply terminal of the current source will be approximately equal to the first power source potential; thus, the fourth transistor will be in the off state. Since the third transistor is in the on state and the fourth transistor is in the off state, the second power source potential signal level is output from the output terminal.

If a Wilson mirror, which is driven by the on state of the first transistor is adopted as the current source, the current will only flow to the current source during the transition period when the level of the output terminal changes making the current consumption small.

In the second output circuit of the present invention, the first current, the second current, and the current that flows in the second transistor are in a proportional relationship, the total of the second and third current is constant, and the third current and the current that flows in the first transistor are in a proportional relationship; thus, when the current that flows in the second transistor increases, the first and second current will increase, making the third current decrease, and the current that flows in the first transistor decrease.

On the other hand, when the current that flows in the second transistor decreases, the first and second current will decrease, making the third current increase, and the current that flows in the first transistor increase. That is, this second output circuit will charge and discharge the output terminal in AB-class operation.

When a Wilson mirror is adopted for the first current source, the current that flows to the third transistor is controlled by the current that flows in the constant current means; thus, if the current which flows in the constant current means is set small, the current consumption in a steady state, in which there is no charge or discharge to the output terminal, will be low.

In the figures, $PT_1$–$PT_7$, $PT_{1a}$–$PT_{3a}$, $PT_{11}$–$PT_{21}$, $PT_{11a}$–$PT_{15a}$ are pMOS transistors, $NT_1$–$NT_3$, $NT_{1a}$–$NT_{3a}$, $NT_{11}$–$NT_{15}$, $NT_{11a}$–$NT_{21a}$ are nMOS transistors, $C_{11}$, $C_{11a}$ are capacitors for phase compensation, and $I_{11}$, $I_{11a}$ are current sources.

DETAILED DESCRIPTION

Embodiment 1

Figure 1:
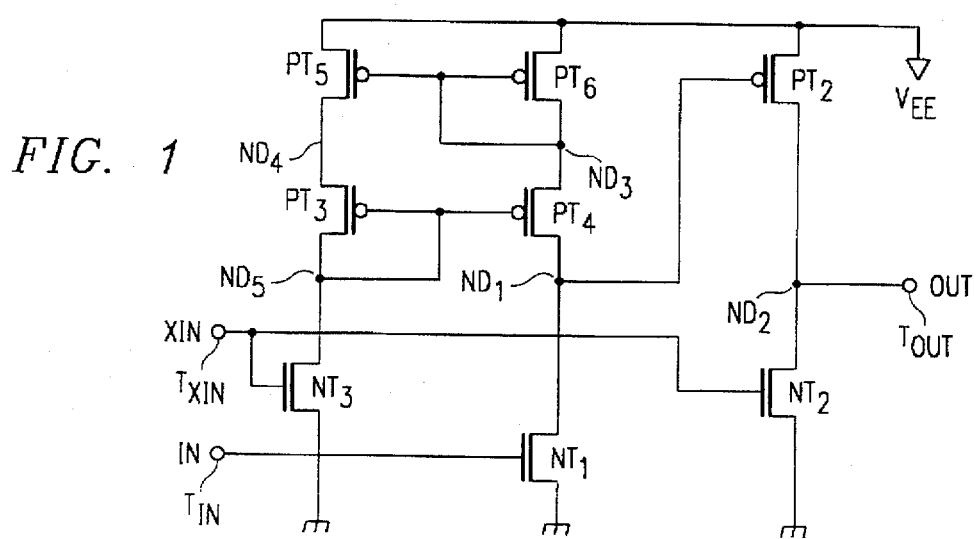
FIG. 1 is a circuit diagram of a first embodiment of an output circuit (level shifter) in accordance with the present invention.

FIG. 1 is a circuit diagram illustrating the first application example of output circuit (level shifter) in accordance with the present invention. Parts that are identical to those in FIG. 12, which illustrates a conventional example, will be given the same reference numerals.

That is, $PT_2$–$PT_6$ indicate pMOS transistors and $NT_1$–$NT_3$ indicate nMOS transistors.

Figure 12:
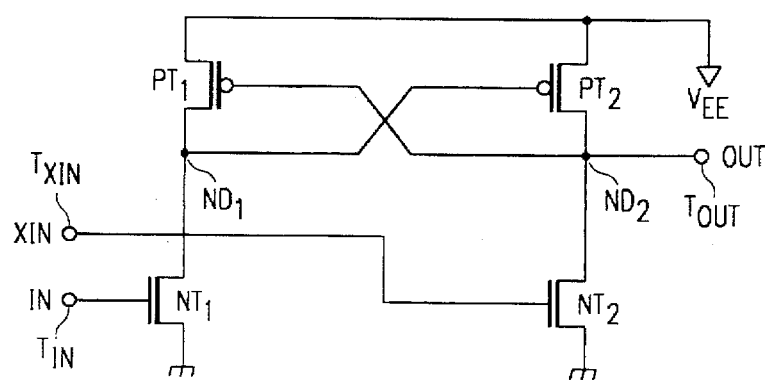
FIG. 12 is a circuit diagram of an example of a level shifter as a conventional output circuit.

In the present circuit, instead of the pMOS transistor $PT_1$ on the input side in the conventional circuit, illustrated in FIG. 12, a current mirror comprised by pMOS transistors $PT_3$–$PT_6$ is provided. This current mirror is comprised such that it is not operated by output signal, but by the input signal XIN by supplying the input signal XIN in the gate of nMOS transistor $NT_3$.

The pMOS transistor $PT_3$ and the pMOS transistor $PT_5$, and the pMOS transistor $PT_4$ and the pMOS transistor $PT_6$ are connected to each other in series and the nodes $ND_4$ and $ND_3$ are comprised by the midpoint of the connection of each.

The sources of pMOS transistor $PT_5$ and pMOS transistor $PT_6$ are connected to the high-voltage $V_{EE}$ supply line, the gates of pMOS transistor $PT_5$ and pMOS transistor $PT_3$ are connected to each other, and the midpoint of the connection is connected to node $ND_3$. The gates of pMOS transistor $PT_3$ and pMOS transistor $PT_4$ are connected to each other.

The drain of pMOS transistor $PT_4$ and the drain of nMOS transistor $NT_1$ are connected to each other to constitute node $ND_1$, and this node $ND_1$ is connected to the gate of pMOS transistor $PT_2$ in the output stage.

Furthermore, the drains of nMOS transistor $NT_3$ and pMOS transistor $PT_3$ are connected to each other to constitute node $ND_5$, and this node $ND_5$ is connected to the midpoint of the connection of the gates of pMOS transistor $PT_3$ and pMOS transistor $PT_4$. The gate of nMOS transistor $NT_3$ is connected to the input terminal $T_{XIN}$ of signal XIN.

With the pMOS transistors $PT_3$–$PT_6$ connected in this manner, the so-called "Wilson" current mirror is comprised.

In this Wilson mirror, with the $\beta(=W/L)$ ratio of pMOS transistors $PT_3$ and $PT_5$ and pMOS transistors $PT_4$ and $PT_6$, the current ratio of each path is determined. W and L respectively represent the gate width and gate length of the MOS transistors.

Next, the operation of the aforementioned construction will be explained.

For instance, the signal IN, which has been switched from the ground level 0 V to the power source voltage $V_{DD}$ level, for instance, 5 V, is supplied to the gate of nMOS transistor $NT_1$, and the signal XIN, which has a level complementary to that of signal IN is switched from 5 V to 0 V, and supplied to the gates of nMOS transistors $NT_2$ and $NT_3$. Consequently, the nMOS transistor $NT_1$ will be in the on state, and the nMOS transistors $NT_2$ and $NT_3$ will be in the off state.

Because the nMOS transistor $NT_1$ is in the on state, node $ND_1$ is pulled to the ground level, and accompanying this phenomenon, the gate potential of pMOS transistor $PT_2$ is also lowered; thus the pMOS transistor $PT_2$ will be in the on state. Consequently, the output side node $ND_2$ is pulled up to a high voltage $V_{EE}$.

That is, the input voltage of 5 V is converted to high voltage $V_{EE}$ of 15 V, and output as OUT.

Also, because the nMOS transistor $NT_3$ in the input side is in the off state, the pMOS transistors $PT_3$–$PT_6$ which constitute the Wilson mirror will be in the off state.

In this manner, the supply of high voltage $V_{EE}$ to the input side node $ND_1$ will be cut off, the lowering of the potential of node $ND_1$ will be accelerated, and the output OUT will be securely maintained at the high voltage $V_{EE}$ level.

When the input signal level is switched, the signal IN is supplied to the gate of nMOS transistor $NT_1$ at 0 V, and the signal XIN, which has a level complementary to that of signal IN, is supplied to the gates of nMOS transistors $NT_2$ and $NT_3$ at 5 V, nMOS transistor $NT_1$ will be switched from the on state to the off state, and nMOS transistors $NT_2$ and $NT_3$ will be switched from the off state to the on state.

Accompanying the fact that the nMOS transistor $NT_2$ is in the on state, the output side node $ND_2$ is pulled to the ground level. Consequently, the input voltage of 0 V is output as OUT at 0 V.

At this time, because the nMOS transistor $NT_3$ is also in the on state, current will flow in the pMOS transistors $PT_3$–$PT_6$, which constitute the current mirror.

In this manner, the potential of the input side node $ND_1$ will be pulled up toward the high voltage $V_{EE}$. The high voltage $V_{EE}$ level of input side node $ND_1$ is supplied to the gate of pMOS transistor $PT_2$. In this manner, the pMOS transistor $PT_2$ is kept in the off state, the high voltage $V_{EE}$ supply to the output side node $ND_2$ is cut off, the lowering of the potential of node $ND_2$ is accelerated, and the output OUT is kept at the ground level.

When the potential of the input side $ND_1$ increases close to the high voltage $V_{EE}$ level, the potential of node $ND_3$ will also increase approaching the high voltage $V_{EE}$ level, and the voltage $V_{GS}$ between the gate and the source of pMOS transistor $PT_6$ will be small. Thus, the pMOS transistor $PT_6$ will be in a cut-off state.

Therefore, no current will flow in pMOS transistor $PT_5$ or $PT_3$ either. That is, only a transition current will flow in the current mirror, and the DC current will be zero.

Figure 2A:
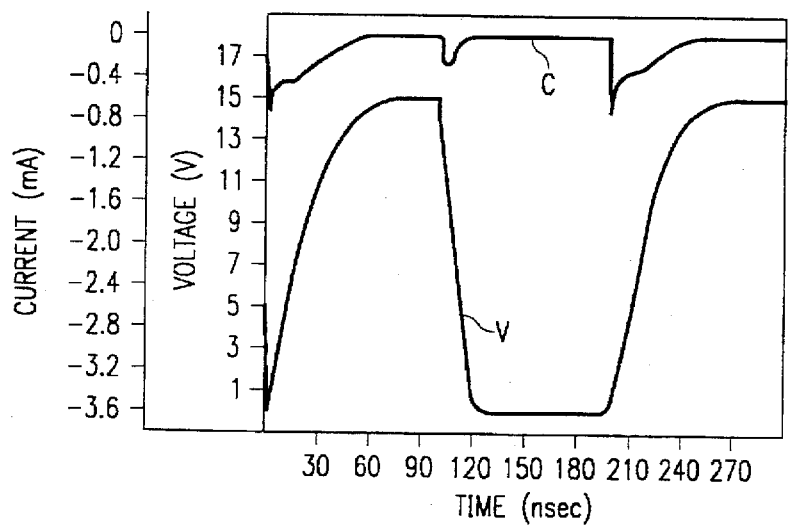
FIG. 2 graphs the simulated results of current consumption using the circuit of FIG. 1 and the conventional circuit; (A) illustrates the simulated result using the circuit of the present invention, and (B) illustrates the simulated result using the conventional circuit.
Figure 2B:
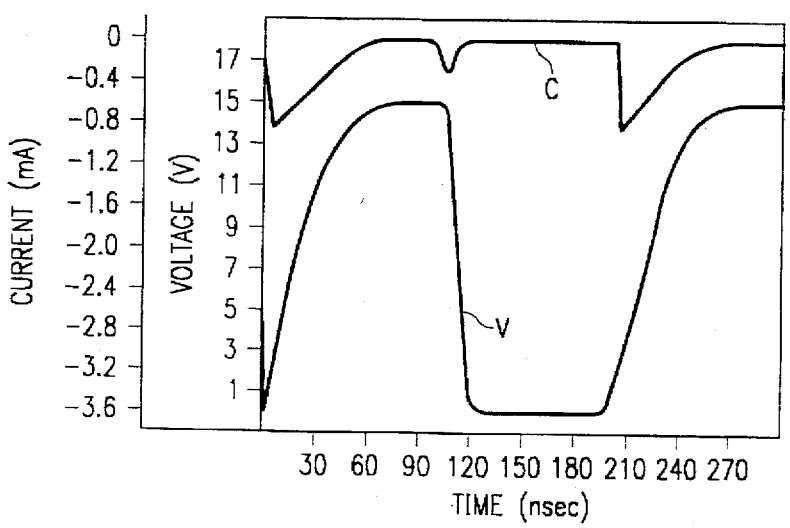

FIG. 2 illustrates the simulated results of current consumption when the circuit of the present invention, illustrated in FIG. 1, and the conventional circuit, illustrated in FIG. 12, are used. (A) illustrates the simulated result of the circuit of the present invention, and (B) illustrates the simulated result of the conventional circuit. In FIG. 2, the horizontal axis expresses time, and the vertical axis expresses current and voltage, respectively. In the figures, curve C indicates the current characteristics, while curve V indicates the voltage characteristics.

As a result of the present simulation, the one-cycle ampere-hour of the conventional circuit is $2.61 \times 10^{-8}$ mA·sec, while the one-cycle ampere-hour of the circuit of the present invention is $1.96 \times 10^{-8}$ mA·sec. Thus, it was confirmed that a lower current consumption could be realized with the circuit of the present invention.

As explained above, by the present application example, the circuit structure does not involve the feedback of the output signal, but is constructed by connecting the current mirror between the input side node (the current output node of the current mirror) $ND_1$ and the high-voltage $V_{EE}$ supply line for driving control of this current mirror by the nMOS transistor $NT_3$, which is turned on/off depending on the input state of input signal XIN. Thus, the operational speed will be high and the circuit will not be affected by the load attached to the output.

Also, since the operational speed is high and the switching time is short, the occurrence of through current, which occurs when both pMOS ,and nMOS transistors $PT_2$ and $NT_2$ are in the on state, which is rare, thus there is another advantage in which the current consumption is low.

Embodiment 2

Figure 3:
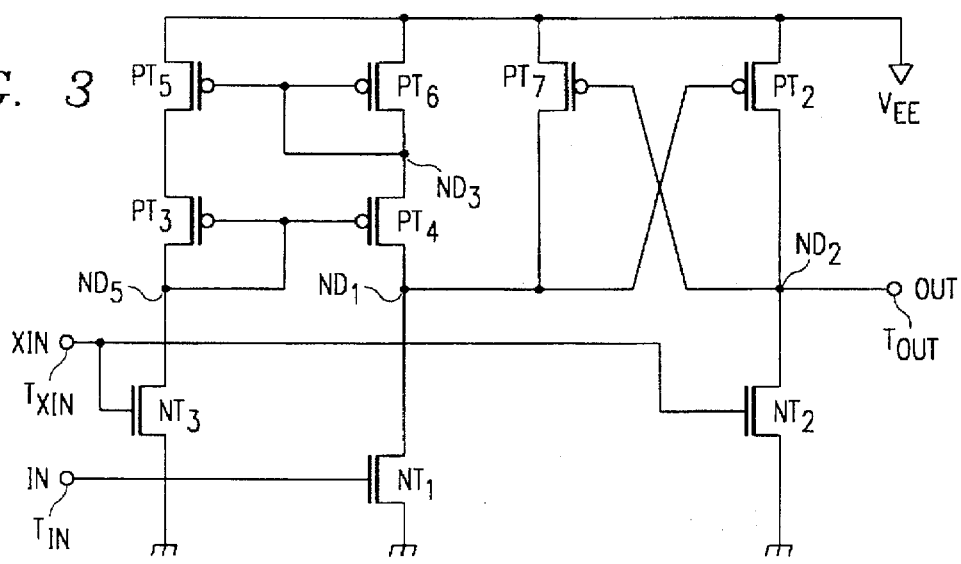
FIG. 3 is a circuit diagram of a second embodiment of the output circuit (level shifter) in accordance with the present invention.

FIG. 3 is a circuit diagram illustrating the second application example of the output circuit (level shifter) in accordance with the present invention.

The point that differs in the present application example from Application Example 1 is that the pMOS transistor $PT_7$ is connected in parallel with the pMOS transistors $PT_6$ and $PT_4$, which constitute the current mirror, that is, between the high-voltage $V_{EE}$ supply line and the input side node $ND_1$. The output signal is fed back to the gate of this pMOS transistor $PT_7$. It is constructed, so that when the output OUT is at the ground level 0 V, the input side node $ND_1$ will be exactly opposite the high voltage $V_{EE}$ level.

That is, in the circuit of FIG. 1, the potential $V_{ND1}$ of the node $ND_1$ will be $V_{EE}-V_{TP}$ L $V_{ND1}$ L $V_{EE}$) when it is to be controlled to maintain the $V_{EE}$ level, thus cannot be exactly opposite $V_{EE}$. By the present construction, however, it can be exactly opposite the $V_{EE}$ level.

Otherwise, the construction is the same as Application Example 1. In addition to the effect of Application Example 1, this example has the advantage of realizing more secure operations.

Figure 4A:
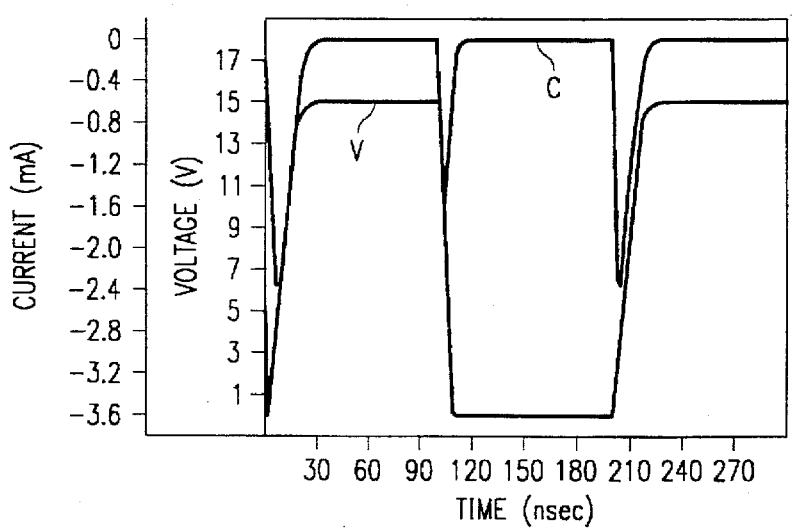
FIG. 4 graphs the simulated results of current consumption using the circuit of FIG. 3 and the conventional circuit; (A) illustrates the simulated result using the circuit of the present invention, and (B) illustrates the simulated result using the conventional circuit.
Figure 4B:
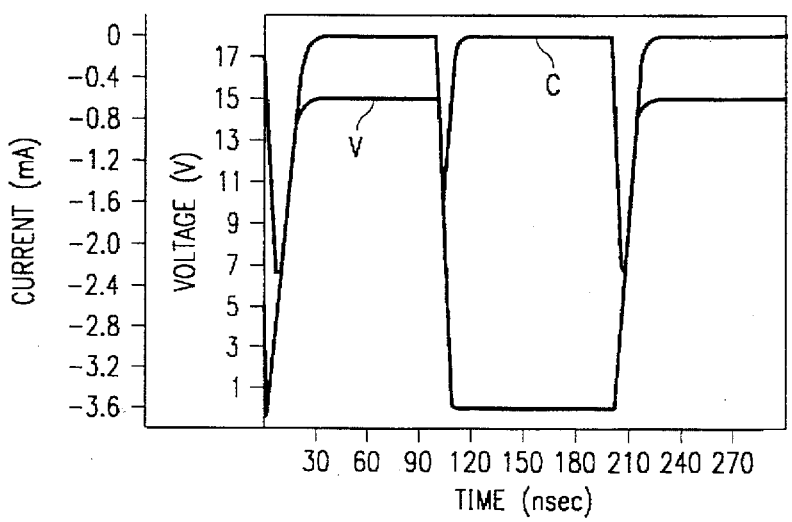

FIG. 4 illustrates the simulated results of the current consumption when the circuit of the present invention, illustrated in FIG. 3, and the conventional circuit, illustrated in FIG. 12, are used. (A) illustrates the simulated result of the circuit of the present invention, and (B) illustrates the simulated result of the conventional circuit. In FIG. 4, the horizontal axis expresses time, and the vertical axis expresses current and voltage, respectively. In the figure, curve C illustrates current characteristics, while curve V illustrates voltage characteristics.

As a result of the present simulation, while the one-cycle ampere-hour of the conventional circuit is $3.26 \times 10^{-8}$ mA·sec, the one-cycle ampere-hour of the circuit of the present invention is $3.15 \times 10^{-8}$ mA·sec, thus it was confirmed that the current consumption is lowered by the circuit of the present invention.

Embodiment 3

Figure 5:
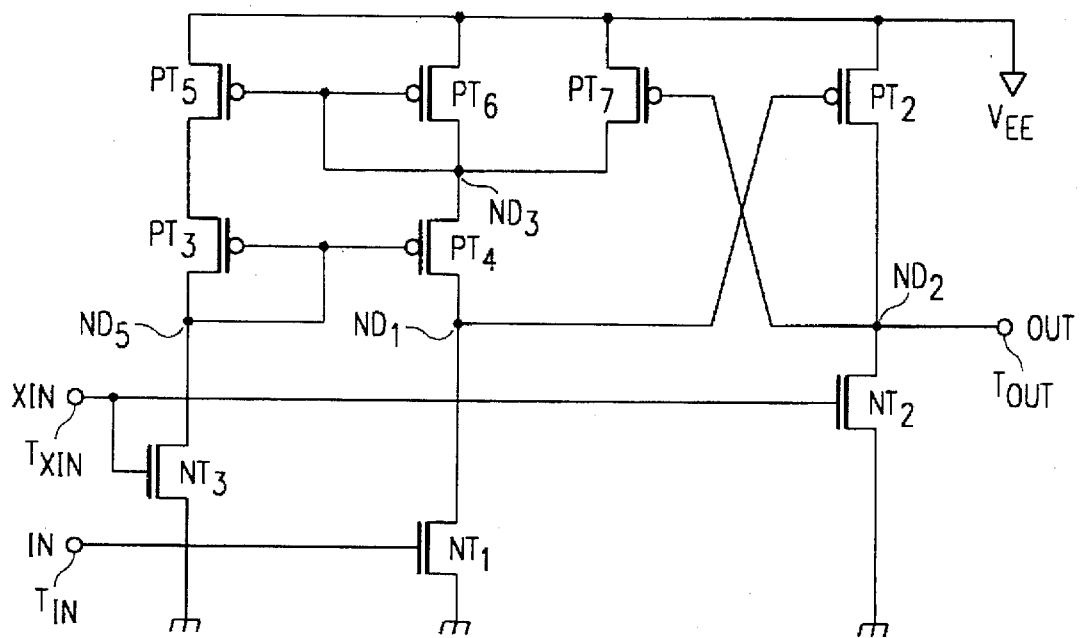
FIG. 5 is a circuit diagram of a third embodiment of the output circuit (level shifter) in accordance with the present invention.

FIG. 5 is a circuit diagram illustrating the third application example of the output circuit (level shifter) in accordance with the present invention.

The point which differs in the present application example from Application Example 2 is that the drain of pMOS transistor $PT_7$ is not connected to node $ND_1$, but to node $ND_3$, which is the midpoint of the connection between pMOS transistors $PT_6$ and $PT_4$.

Otherwise, the construction is the same as that of Application Example 2. Also, in a construction similar to Application Example 2, when the output OUT is at the ground level 0 V, the input side node $ND_1$ can be exactly opposite to the high voltage $V_{EE}$ level.

Embodiment 4

Figure 6:
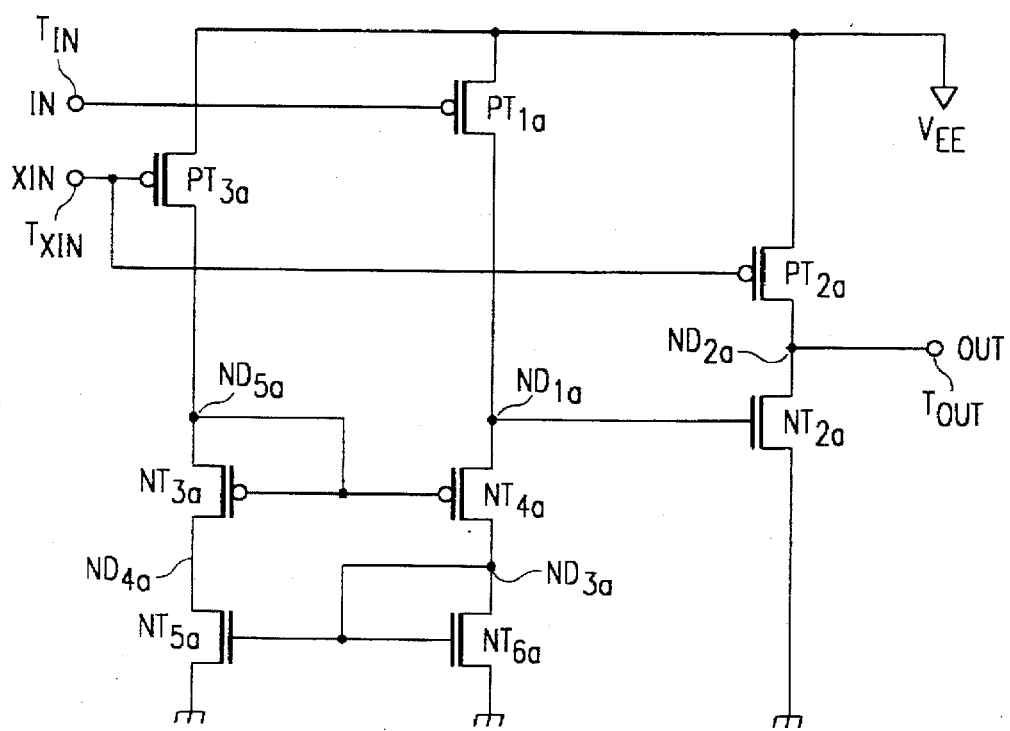
FIG. 6 is a circuit diagram of a fourth embodiment of an output circuit (level shifter) in accordance with the present invention.

FIG. 6 is a circuit diagram illustrating the fourth application example of the output circuit (level shifter) in accordance with the present invention. This circuit is one in which the amplitude is shifted in the negative direction.

Therefore, the polarity of each transistor is inverted. That is, in FIG. 1, instead of p-channel transistors, n-channel transistors are used, and instead of n-channel transistors, p-channel transistors are used.

In the present circuit, the sources of pMOS transistors $PT_{1a}$–$PT_{3a}$ are connected to the high-voltage $V_{EE}$ supply line (for instance, 15 V), and the sources of nMOS transistors $NT_{2a}$ $NT_{5a}$, and $NT_{6a}$ are connected to ground.

The drains of pMOS transistor $PT_{1a}$ and nMOS transistor $NT_{4a}$ are connected to each other to constitute node $ND_{1a}$. The drains of pMOS transistor $PT_{2a}$ and nMOS transistor $NT_{3a}$ are connected to each other to constitute node $ND_{2a}$. The drains of pMOS transistor $PT_{3a}$ and nMOS transistor $NT_{2a}$ are connected to each other to constitute node $ND_{5a}$.

Node $ND_{1a}$ is connected to the gate of nMOS transistor $NT_{2a}$, the gate of pMOS transistor $PT_{1a}$ is connected to the input terminal $T_{IN}$ of signal IN, and the gates of pMOS transistors $PT_{2a}$ and $PT_{3a}$ are connected to the input terminal $T_{XIN}$ of signal XIN.

Then, nMOS transistors $NT_{3a}$ and $NT_{5a}$ and nMOS transistors $NT_{4a}$ and $NT_{6a}$ are connected in series, respectively, the gates of nMOS transistors $NT_{3a}$ and $NT_{4a}$ are connected to each other, and the midpoint of the connection is connected to node $ND_{5a}$. Furthermore, the gates of nMOS transistors $NT_{5a}$ $NT_{6a}$ are connected to each other, the midpoint of the connection is connected to node ($ND_{3a}$), and the Wilson mirror is constructed.

In such a construction, for instance, signal IN, which is switched from the power source voltage $V_{EE}$ level, for instance, 15 V, to 10 V, is supplied to the gate of pMOS transistor $PT_{1a}$, the signal XIN which has a level complementary to that of signal IN is switched from 10 V to 15 V and supplied to the gates of nMOS transistors $PT_{2a}$ and $PT_{3a}$. Consequently, the pMOS transistor $PT_{1a}$ will be in the on state, and the pMOS transistors $PT_{2a}$ and $PT_{3a}$ will be in the off state.

Because the pMOS transistor $PT_{1a}$ is in the on state, node $ND_{1a}$ will be high voltage $V_{EE}$ level, and accompanying this phenomenon, the gate potential of nMOS transistor $NT_{2a}$ will also increase. Thus, the nMOS transistor $NT_{2a}$ will be in the on state. Consequently, the output side node $ND_{2a}$ is pulled to the ground level.

That is, the input voltage of 10 V is output as OUT of 0 V.

Also, because the input side pMOS transistor $PT_{3a}$ is in the off state, the nMOS transistors ($NT3a$)–($NT6a$) which constitute the Wilson mirror, will be in the off state.

In this manner, the raising of the potential of node $ND_{1a}$ will be accelerated and the output OUT will be kept at the ground level.

When the input signal level is switched, signal IN is supplied to the gate of pMOS transistor $PT_{1a}$ with 15 V, and signal XIN, which has a level complementary to that of signal IN, is supplied to the gates of pMOS transistors $PT_{2a}$ and $PT_{3a}$, the pMOS transistor $PT_{1a}$ will be switched from the on state to the off state, while the pMOS transistors $PT_{2a}$ and $PT_{3a}$ are switched from the off state to the on state.

Accompanying the fact that the PMOS transistor $PT_{2a}$ is in the on state, the output side node $ND_{2a}$ will be a high voltage $V_{EE}$. Consequently, the input voltage of 15 V will be output as OUT maintaining 15 V.

At this time, because the pMOS transistor $PT_{3a}$ is also in the on state, current will flow in the nMOS transistors $NT_{3a}$–$NT_{6a}$, which constitute the current mirror.

In this manner, the potential of the input side node $ND_{1a}$ is pulled up toward the ground level. The ground level of the input side node $ND_{1a}$ is supplied to the gate of nMOS transistor $NT_{2a}$. In this manner, the nMOS transistor $NT_{2a}$ is kept in the off state, and the connection of the output side node $ND_{2a}$ to ground is cut off. In this manner, the potential increase of node $ND_{2a}$ is accelerated and the output OUT is kept at the high voltage $V_{EE}$ level.

Then, when the potential of the input side $ND_{1a}$ is lowered close to the ground level, the potential of node $ND_{3a}$ is raised to the vicinity of the ground level, and the voltage $V_{GS}$ between the gate and source of nMOS transistor $NT_{6a}$ will be small. Because of this phenomenon, the nMOS transistor $NT_{6a}$ will be in the cut-off state.

Therefore, no current will flow to nMOS transistor $NT_{5a}$ or $NT_{3a}$. That is, only a transitional current will flow in the current mirror, and the DC current will be zero.

As explained above, in the present application example also, an effect similar that of Application Example 1 can be obtained.

Embodiment 5

Figure 7:
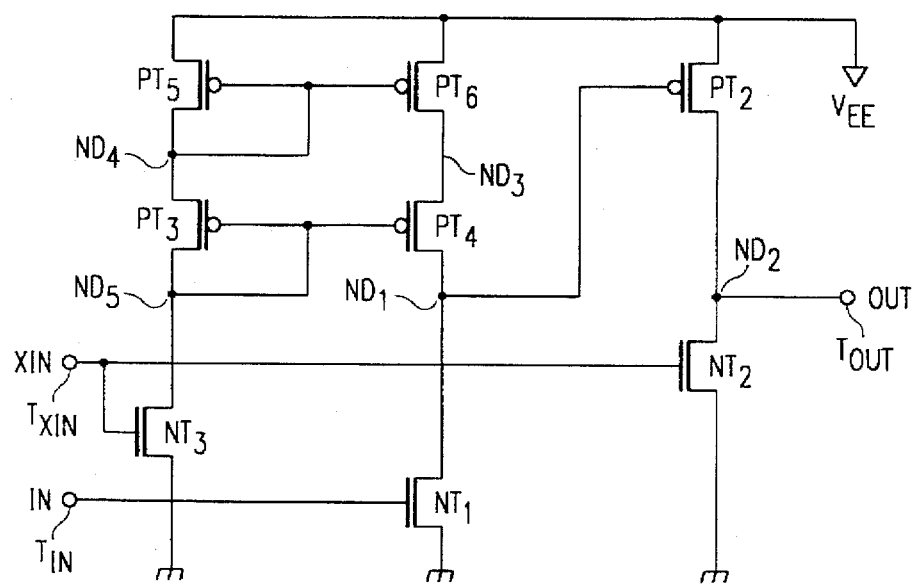
FIG. 7 is a circuit diagram of a fifth embodiment of an output circuit (level shifter) in accordance with the present invention.

FIG. 7 is a circuit diagram illustrating the fifth application example of the output circuit (level shifter) in accordance with the present invention.

The point which differs in the present application example from Application Example 1 is that the midpoint of the connection of the gates of pMOS transistors $PT_5$ and $PT_6$ of the current mirror is not connected to the midpoint of the connection $ND_3$ between the pMOS transistors $PT_6$ and $PT_4$, but connected to the connection midpoint $ND_4$ between pMOS transistors $PT_5$ and $PT_3$, and that the current mirror is not a Wilson mirror, but is constructed as the so-called cascade current mirror.

In such a construction, when nMOS transistor $NT_3$ is in the on state, a DC current will flow in pMOS transistors $PT_5$ and $PT_3$. However, since the load attached to the output does not affect the circuit, the operational speed can be improved.

Embodiment 6

Figure 8:
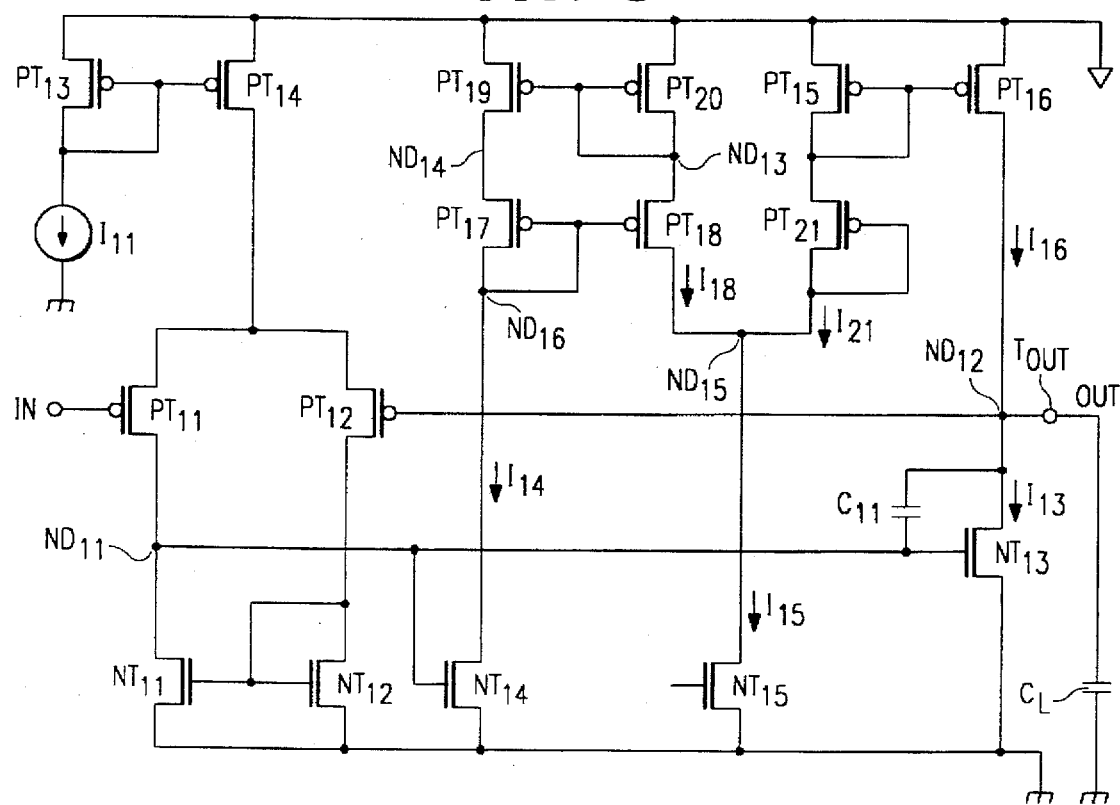
FIG. 8 is a circuit diagram of a sixth embodiment of an output circuit (operational amplifier) in accordance with the present invention.

FIG. 8 is a circuit diagram illustrating the sixth application example of the output circuit (CMOS operational amplifier) in accordance with the present invention. The parts identical to those in FIG. 13, which illustrates the conventional example, are indicated with the same reference numerals.

That is, $PT_{11}$–$PT_{21}$ indicate pMOS transistors, $NT_{11}$–$NT_{15}$ indicate nMOS transistors, $I_{11}$ indicates the current source, $C_{11}$ indicates the capacitor for phase compensation, and $C_L$ indicates output load capacitance.

Figure 13:
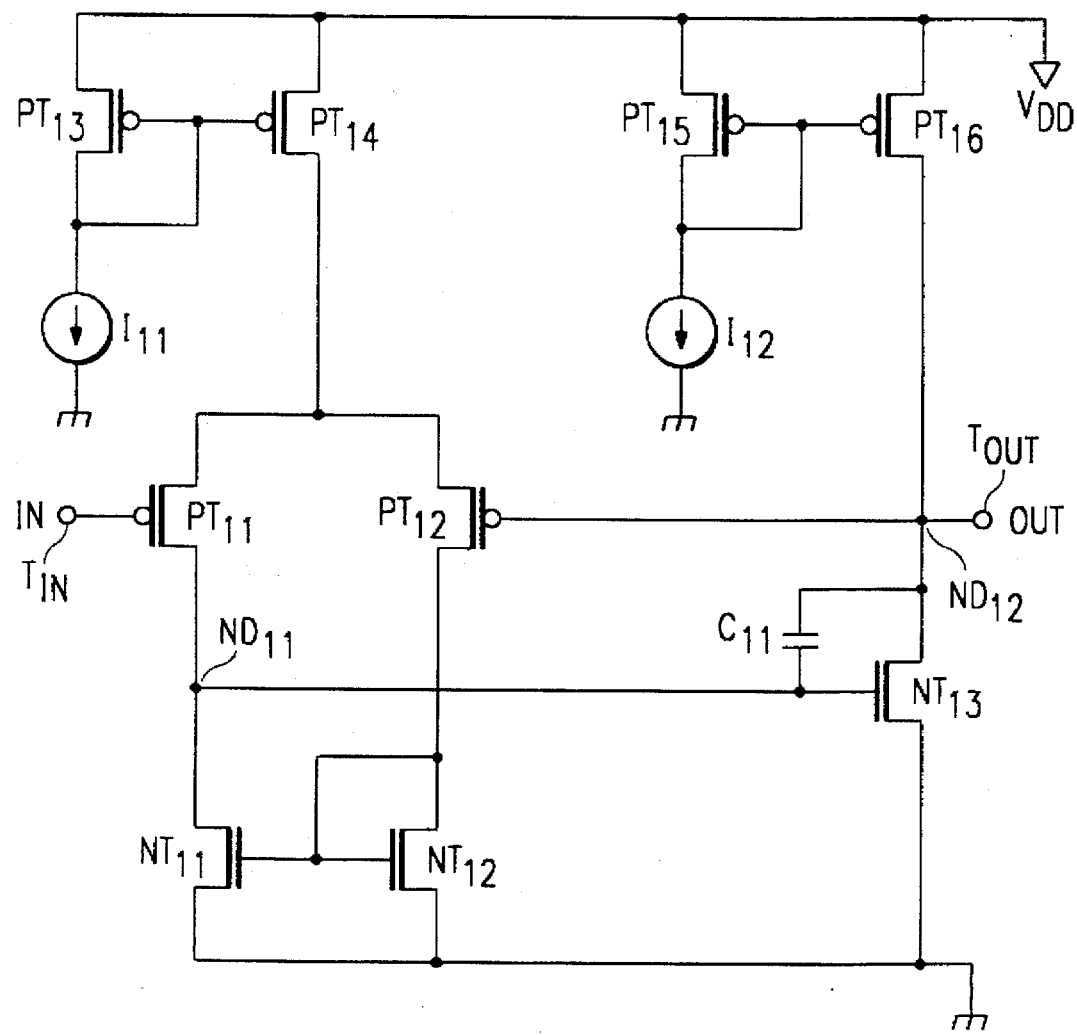
FIG. 13 is a circuit diagram of a CMOS operational amplifier as a conventional output circuit.
Figure 14:
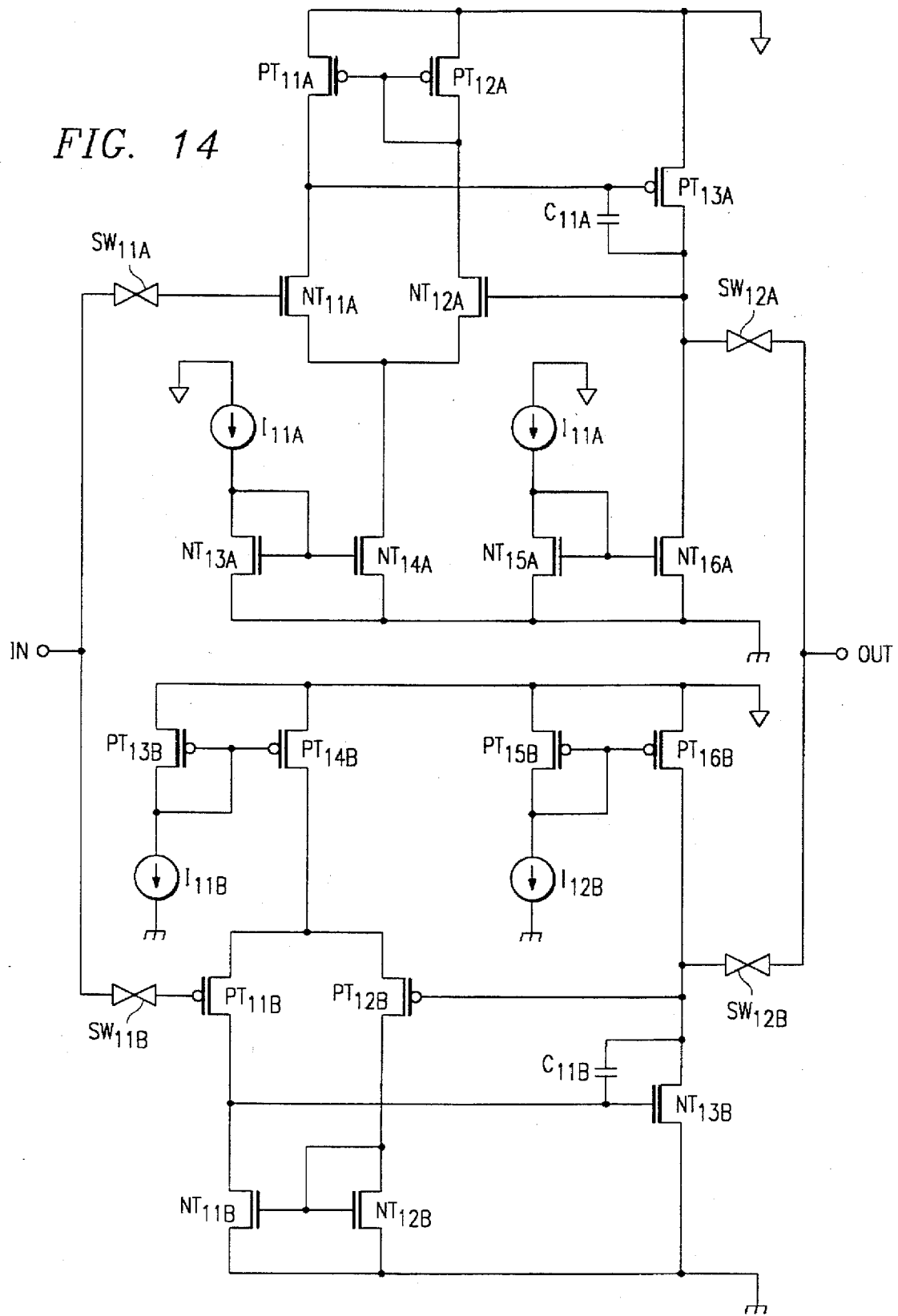
FIG. 14 is a circuit diagram of a conventional CMOS operational amplifier with an amplifier for charging and an amplifier for discharging.

In the present circuit, in the stage after the first stage differential amplifier in the conventional circuit, illustrated in FIG. 13, the Wilson mirror, which is composed of pMOS transistors $PT_{17}$–$PT_{20}$, is arranged. It is constructed such that the output of the first stage differential amplifier is supplied to the gate of nMOS transistor $NT_{14}$, and the current that flows in the Wilson mirror is supplied to the output stage side through the current mirror, which is composed of pMOS transistors $PT_{15}$ and $PT_{16}$.

The pMOS transistor $PT_{17}$ and the pMOS transistor $PT_{19}$, and pMOS transistor $PT_{18}$ and the pMOS transistor $PT_{20}$ are connected in series to each other, and nodes $ND_{14}$ and $ND_{13}$ are comprised by each midpoint of the connections.

The sources of pMOS transistor $PT_{15}$ and pMOS transistor $PT_{20}$ are connected to the high-voltage $V_{EE}$ supply line, the gates of pMOS transistor $PT_{19}$ and pMOS transistor $PT_{20}$ are connected to each other, and the midpoint of the connection is connected to node $ND_{13}$. Also, the gates of pMOS transistor $PT_{17}$ and pMOS transistor $PT_{18}$ are connected to each other.

Then, the drains of pMOS transistor $PT_{18}$ and nMOS transistor $NT_{15}$ are connected to each other to constitute node $ND_{15}$. This node $ND_{15}$ is connected to the output stage, and is connected to both the drain and the gate of pMOS transistor $PT_{21}$ to match the levels with pMOS transistors $PT_{20}$ and $PT_{18}$.

The source of pMOS transistor $PT_{21}$ is connected to the drain of pMOS transistor $PT_{15}$. The source of nMOS transistor $NT_{15}$ is connected to ground and the gate is connected to the constant voltage supply line, not illustrated. That is, a constant current is generated by nMOS transistor $NT_{15}$.

Furthermore, the drains of pMOS transistor $PT_{17}$ and nMOS transistor $NT_{14}$ are connected to each other to constitute node $ND_{16}$. This node $ND_{16}$ is connected to the gates of pMOS transistors $PT_{17}$ and $PT_{18}$. The source of nMOS transistor $NT_{14}$ is connected to ground, and the gate is connected to node $ND_{11}$.

Next, supposing the current that flows in the drains of nMOS transistors $NT_{13}$, $NT_{14}$, and $NT_{15}$ is respectively $I_{13}$, $I_{14}$, and $I_{15}$, and supposing the current that flows in the pMOS transistors $PT_{18}$, $PT_{21}$, and $PT_{16}$ is respectively $I_{18}$, $I_{21}$, and $I_{16}$, the operation in the aforementioned construction will be explained mainly in terms of the flow of current.

First, the case when the gate voltage of nMOS transistor $NT_{13}$ in the output stage increases, and the output load is discharged will be explained.

For instance, when analog input signal IN is supplied to the gate of pMOS transistor $PT_{11}$ of the differential amplifier at a low level, which is close to the ground level, the gate voltage of nMOS transistors $NT_{13}$ and $NT_{14}$ in the output amplification stage will increase, and the drain current $I_{13}$ and $I_{14}$ of nMOS transistors $NT_{13}$ is and $NT_{14}$ will increase. Here, the nMOS transistors $NT_{13}$ and $NT_{14}$ are assumed to have the same transistor size.

From each of the pMOS transistors $PT_{17}$–$PT_{20}$, which constitute the current mirror, the current $I_{18}$ flows into node $ND_{15}$.

Here, the constant current $I_{15}$ flows in the drain side of nMOS transistor $NT_{15}$, which has a constant current supplied to the gate. This constant current $I_{15}$, as indicated in the equation below, is the sum of the drain current $I_{18}$ of pMOS transistor $PT_{18}$, which flows into node $ND_{15}$ and the drain current $I_{21}$ of pMOS transistor $PT_{21}$.

$$I_{15}=I_{18}+I_{21} \quad (1)$$

Therefore $$I_{21}=I_{15}-I_{18} \quad (2)$$

That is, since the current $I_{18}$ increases along with an increase in the drain current $I_{14}$ of nMOS transistor $NT_{14}$, the drain current $I_1$ of pMOS transistor $PT_{21}$ will decrease.

This current $I_{21}$ will appear as the drain current $I_{16}$ of pMOS transistor $PT_{16}$ in the output stage through the current mirror, thus, the current $I_{16}$ will also decrease along with the decrease in current $I_{21}$.

In this manner, the discharge of the output load is accelerated.

Next, the case in which the gate voltage of nMOS transistor $NT_{13}$ in the output stage will be lowered and the output load is charged will be explained.

In such a case, since the drain current $I_{13}$ of nMOS transistor $NT_{13}$ and the drain current $I_{14}$ of nMOS transistor $NT_{14}$ decrease, the drain current $I_{21}$ of pMOS transistor $PT_{21}$ will increase according to equation (2).

As a result, drain current $I_{16}$ of pMOS transistor $PT_{16}$ in the output stage will increase along with an increase in current $I_{21}$.

In this manner, the charging of the output load will be accelerated.

Next, the case of a steady state, when no charge or discharge to output load $C_1$ is performed, will be explained. In such a case, supposing nMOS transistors $NT_{13}$ and $NT_{14}$ are the same size, the drain current $I_{13}$ of nMOS transistor $NT_{13}$ and the drain current $I_{14}$ of nMOS transistor $NT_{14}$ are equal. And, supposing pMOS transistors $PT_{17}$ and $PT_{18}$, which constitute the current mirror, are the same size, the following equation will be established in terms of the circuit in FIG. 8.

$$I_{14} \cdot (M_{20}/M_{19})=I_{18} \quad (3)$$

$$I_{21} \cdot (M_{16}/M_{15})=I_{16}=I_{13}=I_{14} \quad (4)$$

From equations (3) and (4), and from equation (2), the following equation can be derived.

$$(I_{15}-I_{13} \cdot (M_{20}/M_{19})) \cdot (M_{16}/M_{15})=I_{13} \quad (5)$$

Therefore, $$I_{13}=I_{15}/((M_{20}/M_{19})+(M_{15}/M_{16})) \quad (6)$$

Where, M indicates the transistor size, and the ratio of the transistor is the ratio of W/L.

From equation (6), the current flowing at the steady time, that is, the idling current, can be freely set based on the ratio of the constant current $I_{15}$ and each element.

For instance, if the idling current is set low, and the charge capacitance is set large, then, an operational amplifier that consumes little current but can charge or discharge at a high speed can be realized.

In the present application example, a Wilson mirror is used as the current mirror. Thus, the current that flows in pMOS transistors $PT_{19}$ and $PT_{17}$ is, at the maximum, identical to the constant current $I_{15}$. Therefore, by setting the constant current $I_{15}$ low, further lowering of current consumption can be realized.

Figures 9, 10:
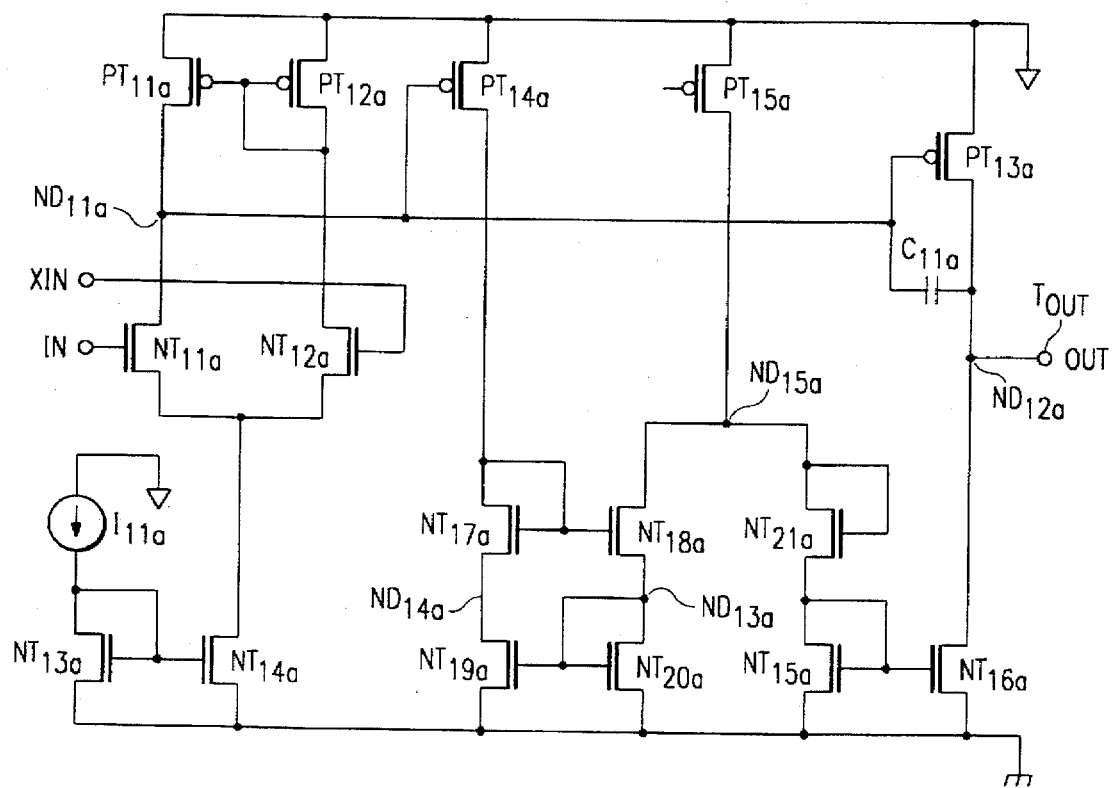
FIG. 9 graphs the simulated results of current consumption conducted using the operational amplifier of FIG. 8 and the conventional operational amplifier.
FIG. 10 is a circuit diagram of a seventh embodiment of an output circuit (operational amplifier) in accordance with the present invention.

FIG. 9 illustrates simulated results of current consumption when the operational amplifier of FIG. 8 in accordance of the present invention and the conventional operational amplifier are used.

This simulation was performed assuming a case in which, for example, 32 operational amplifiers were formed on one semiconductor integrated circuit (chip).

From FIG. 9, the circuit of the present invention can realize a significant reduction in the consumption of current by the chip unit.

As explained above, by the present application example, it is constructed so that a Wilson mirror comprised of pMOS transistors $PT_{17}$–$PT_{20}$ is arranged in the stage after the first stage differential amplifier, the output of the first stage differential amplifier is supplied to the gate of nMOS transistor $NT_{14}$, and the current that flows in the Wilson mirror is supplied to the output stage side through the current mirror comprised of pMOS transistor $PT_{15}$. Thus, it does not carry out A-class operations, but so-called AB-class operations. Therefore, a large current at the time of output discharge only flows in the output stage, thus an excessive current can be reduced.

In this manner, there is an advantage in that a CMOS operational amplifier, which can realize high speed operation at lower power consumption than that of the conventional method while securing a dynamic range similar to that of the conventional method and avoiding becoming large can be realized.

Embodiment 7

FIG. 10 is a circuit diagram illustrating the seventh application example of the output circuit (operational amplifier) in accordance with the present invention. This circuit is a variation of Application Example 6.

In the present circuit, the polarity of each transistor is reversed. That is, instead of p-channel transistors in FIG. 1, n-channel transistors are used, and instead of n-channel transistors, p-channel transistors are used.

Here, since the connectors and functions are approximately the same as those of Application Example 6, further explanation will be omitted.

Also, in the present circuit, an effect similar to that of Application Example 6 can be obtained.

Embodiment 8

Figure 11:
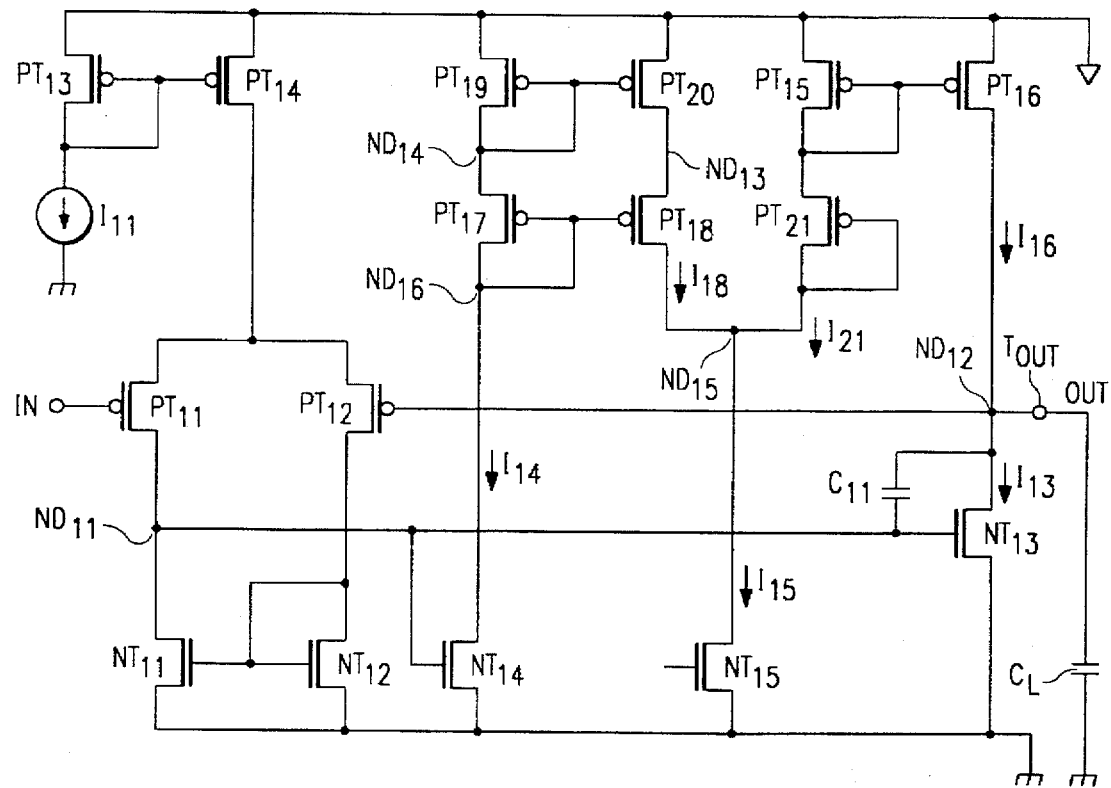
FIG. 11 is a circuit diagram of an eighth embodiment of an output circuit (operational amplifier) in accordance with the present invention.

FIG. 11 is a circuit diagram illustrating the eighth application example of the output circuit (operational amplifier) in accordance with the present invention.

The point which differs in the present application example from the Application Example 6 is that the midpoint of the connection between the gates of pMOS transistors $PT_{19}$ and $PT_{20}$ is not connected to the midpoint of connection $ND_{13}$ between pMOS transistors $PT_{20}$ and $PT_{18}$, but is connected to the midpoint of connection $ND_{14}$ between pMOS transistors $PT_{19}$ and $PT_{17}$, and the current mirror is not comprised of a Wilson mirror, but the so-called cascade current mirror.

Assuming the transistor sizes of nMOS transistors $NT_{13}$ and $NT_{14}$ are approximately the same, in such a construction, a current which is approximately the same as that which flows in nMOS transistor $NT_{13}$ will flow in nMOS transistor $NT_{14}$.

In each of the aforementioned application examples, MOS transistors were adopted as examples. However, naturally, the same type of output circuits can be constructed using bipolar transistors.

EFFECTS OF THE INVENTION

As explained above, the level shifter (output circuit) of the present invention does not have a circuit construction wherein the output signal is fed back, but is constructed so as to control the output level by means of the input signal. Thus, its operational speed is fast and it is not affected by the output load. Also, by using a Wilson mirror, the output level has a current only during the transition period when it changes, thus low power consumption can be realized. Furthermore, since the operational speed is high, switching the transistor on/off is so fast that little through current will flow, making and current consumption low.

The operational amplifier (output circuit) of the present invention carries out an AB-class operation. A large current is only output when charging and discharging load capacitance, and only a small current is output in a steady state when no charge or discharge of load capacitance is performed. Thus, low power consumption and high operational speed are both realized concurrently. Also, since no amplifier for charging and for discharging needs to be installed, there is another advantage in that the operational amplifier does not have to be large.

We claim:

1. A level shifting circuit for converting a voltage level of an input signal and a complement of said input signal to a different voltage level comprising:

first and second potential sources;

a current mirror coupled to said first potential source;

a first circuit coupled between a first leg of said current mirror and said second potential source, said first circuit being controlled by said complement of said input signal;

a second circuit coupled between a second leg of said current mirror and said second potential source, said second circuit being controlled by said input signal;

an output circuit comprising a pair of series connected transistors having an output node therebetween, one of said transistors being coupled to said complementary input signal, the other of said transistors being coupled to said second circuit, whereby said current mirror is controlled by said complementary input signal.

2. The level shifting circuit of claim 1 wherein said current mirror is a Wilson current mirror.

* * * * *